United States Patent
Lin et al.

(10) Patent No.: US 7,487,824 B2
(45) Date of Patent: Feb. 10, 2009

(54) LIQUID COOLING DEVICE

(75) Inventors: Yu-Chen Lin, Tu-Cheng (TW); Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 190 days.

(21) Appl. No.: 11/309,562

(22) Filed: Aug. 23, 2006

(65) Prior Publication Data

US 2007/0240849 A1    Oct. 18, 2007

(51) Int. Cl.
  F28F 7/00   (2006.01)
  H05K 7/20   (2006.01)
(52) U.S. Cl. ............. 165/80.4; 165/104.33; 165/80.3
(58) Field of Classification Search ........... 165/80.4, 165/104.33, 141, 155; 361/699, 700; 257/714, 257/715
See application file for complete search history.

(56) References Cited

U.S. PATENT DOCUMENTS

| | | | | |
|---|---|---|---|---|
| 2,235,669 | A * | 3/1941 | Conklin et al. ............... 165/74 |
| 4,561,040 | A * | 12/1985 | Eastman et al. ............. 361/699 |
| 4,778,002 | A * | 10/1988 | Allgauer et al. ............. 165/141 |
| 5,542,467 | A * | 8/1996 | Carpentier ................... 165/70 |
| 5,735,342 | A * | 4/1998 | Nitta ......................... 165/122 |
| 5,749,413 | A * | 5/1998 | Crowe ....................... 165/80.1 |
| 6,145,584 | A * | 11/2000 | Baynes et al. ................ 165/45 |
| 6,173,760 | B1 * | 1/2001 | Gardell et al. ............. 165/80.4 |
| 6,666,261 | B2 * | 12/2003 | Yang et al. ................. 165/80.4 |
| 7,117,931 | B2 * | 10/2006 | Crocker et al. ......... 165/104.33 |
| 2005/0019234 | A1 * | 1/2005 | Luo ........................... 422/198 |
| 2007/0000648 | A1 * | 1/2007 | Crocker et al. ......... 165/104.33 |

* cited by examiner

*Primary Examiner*—Tho v Duong
(74) *Attorney, Agent, or Firm*—Frank R. Niranjan

(57) ABSTRACT

A liquid cooling device (1) includes a base (2) enclosing working fluid therein and absorbing heat from a heat-generating electronic component, a heat sink (10) fluidically connecting with the base, and a pump (3) driving the working fluid to circulate between the base and the heat sink. The heat sink has closed top and bottom ends, and includes an outer tube (100) and an inner tube (30) disposed in the outer tube. First and second receiving chambers (34, 14) are respectively formed in the inner tube and between an inner surface of the outer tube and an outer surface of the inner tube for receiving the working fluid therein. The first receiving chamber communicates with the second receiving chamber at an end thereof so that the working fluid flows from the first receiving chamber to the second receiving chamber.

18 Claims, 5 Drawing Sheets

LIQUID COOLING DEVICE

FIELD OF THE INVENTION

The present invention relates in general to a cooling device, and more particularly to a liquid cooling device used in association with electronic components.

DESCRIPTION OF RELATED ART

Along with fast developments in electronic information industries, electronic components such as central processing units (CPUs) of computers are made capable of operating at a much higher frequency and a faster speed. As a result, the heat generated by the CPUs during normal operation is commensurately increased. If not quickly removed away from the CPUs this generated heat may cause them to become overheated and finally affect the workability and stability of the CPUs.

In order to remove the heat of the CPUs and hence keep the CPUs in normal working order, cooling devices must be provided to the CPUs to dissipate heat therefrom. Conventionally, extruded heat sinks combined with electric fans are frequently used for this heat dissipation purpose. These conventional cooling devices sufficiently satisfy the heat dissipation requirements for CPUs with low frequencies, but are unsatisfactory at cooling down the current CPUs with high frequencies. Therefore, cooling devices with high heat dissipation efficiencies are needed for dissipating heat generated by high frequency CPUs.

SUMMARY OF THE INVENTION

A liquid cooling device in accordance with an embodiment includes a base enclosing working fluid therein and absorbing heat from a heat source, a heat sink fluidically connecting with the base, and a pump driving the working fluid to circulate between the base and the heat sink. The heat sink has closed top and bottom ends, and includes an outer tube and an inner tube disposed in the outer tube. First and second receiving chambers are respectively formed in the inner tube and between an inner surface of the outer tube and an outer surface of the inner tube for receiving the working fluid therein. The first receiving chamber communicates with the second receiving chamber at an end thereof so that the working fluid flows from the base, the pump, the first receiving chamber, then the second receiving chamber and finally back to the base.

Other advantages and novel features will become more apparent from the following detailed description of preferred embodiments when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
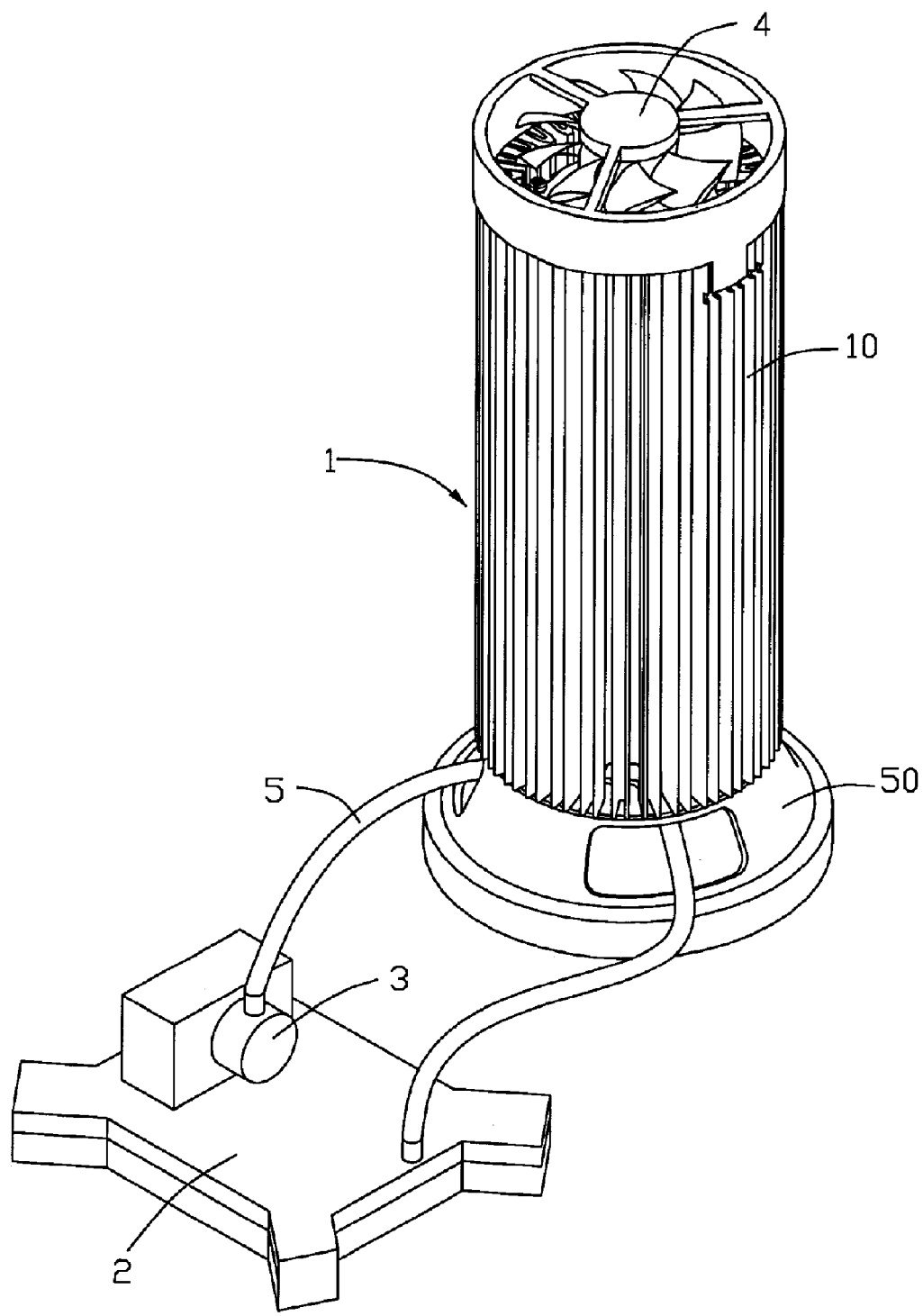
FIG. 1 is an assembled, isometric view of a liquid cooling device in accordance with a preferred embodiment of the present invention.
Figure 2:
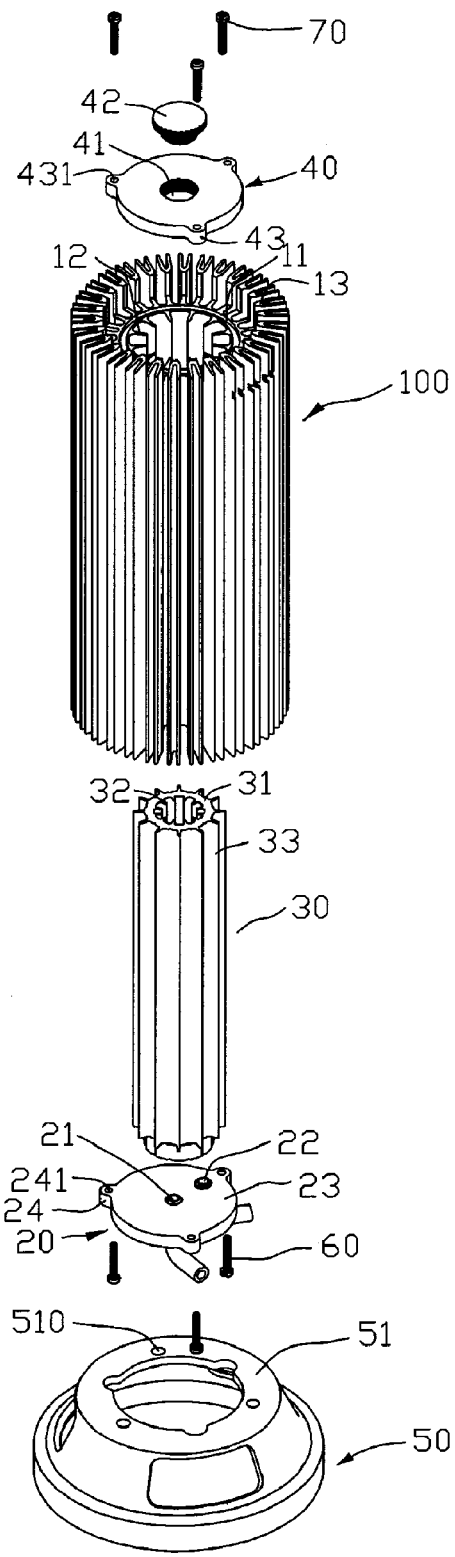
FIG. 2 is an exploded, isometric view of a heat sink of the liquid cooling device of FIG. 1.
Figure 3:
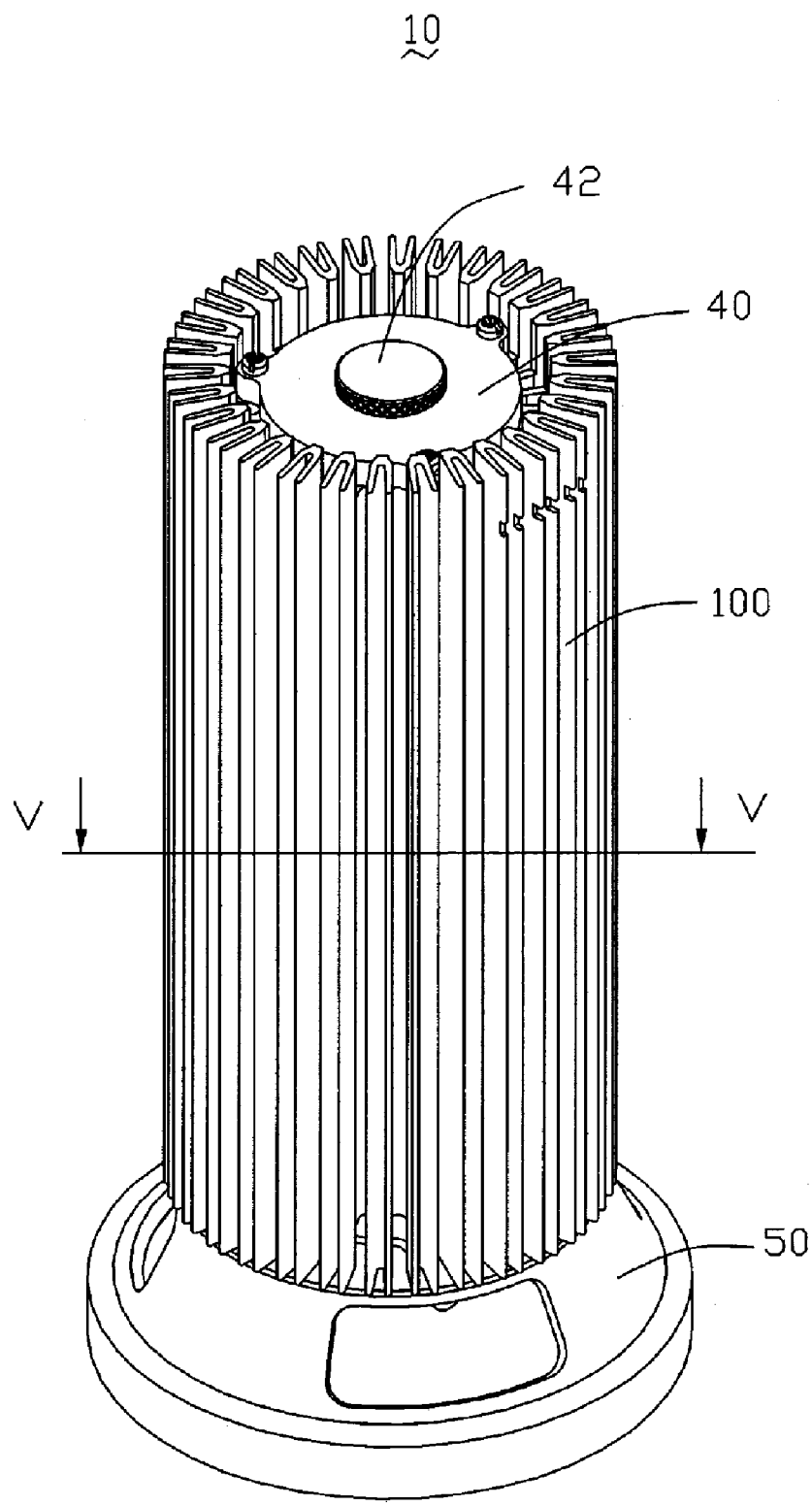
FIG. 3 is an assembled view of the heat sink of FIG. 2.

Referring to FIG. 1, a liquid cooling device 1 in accordance with a preferred embodiment of the present invention is shown. The liquid cooling device 1 comprises a heat sink 10, a base 2, a pump 3, a fan 4, and two conduits 5. The base 2 thermally contacts with a heat source, such as a CPU (not shown), for absorbing heat therefrom. The conduits 5 connect the base 2 with the heat sink 10, cooperatively defining a fluid channel therebetween for passage of a working fluid. The pump 3 is disposed on the base 2, driving the working fluid to circulate in the fluid channel. The heat absorbed from the heat source is transferred from the base 2 to the heat sink 10 by the circulation of the working fluid. The fan 4 is mounted on the heat sink 10, providing an airflow flowing through the heat sink 10 to take heat thereaway.

Referring to FIGS. 2 through 5, the heat sink 10 includes an outer tube 100, an inner tube 30 coaxially disposed in the outer tube 100, circular first and second covering plates 20, 40 attached to bottom and top ends of the outer tube 100, and a seat 50 disposed below the outer tube 100.

The first and second covering plates 20, 40, and the outer tube 100 cooperatively define a hermetical chamber (not labeled) therebetween. The inner tube 30 is disposed in the hermetical chamber with a bottom end thereof coplanar with the bottom end of the outer tube 100. The first covering plate 20 has a top surface 23 coplanar with the bottom ends of the outer and inner tubes 100, 30. Two O-rings (not shown) are disposed between the bottom ends of the outer and inner tubes 100, 30 and the top surface 23 of the first covering plate 20, so as to obtain a hermetical attachment therebetween.

Figure 4:
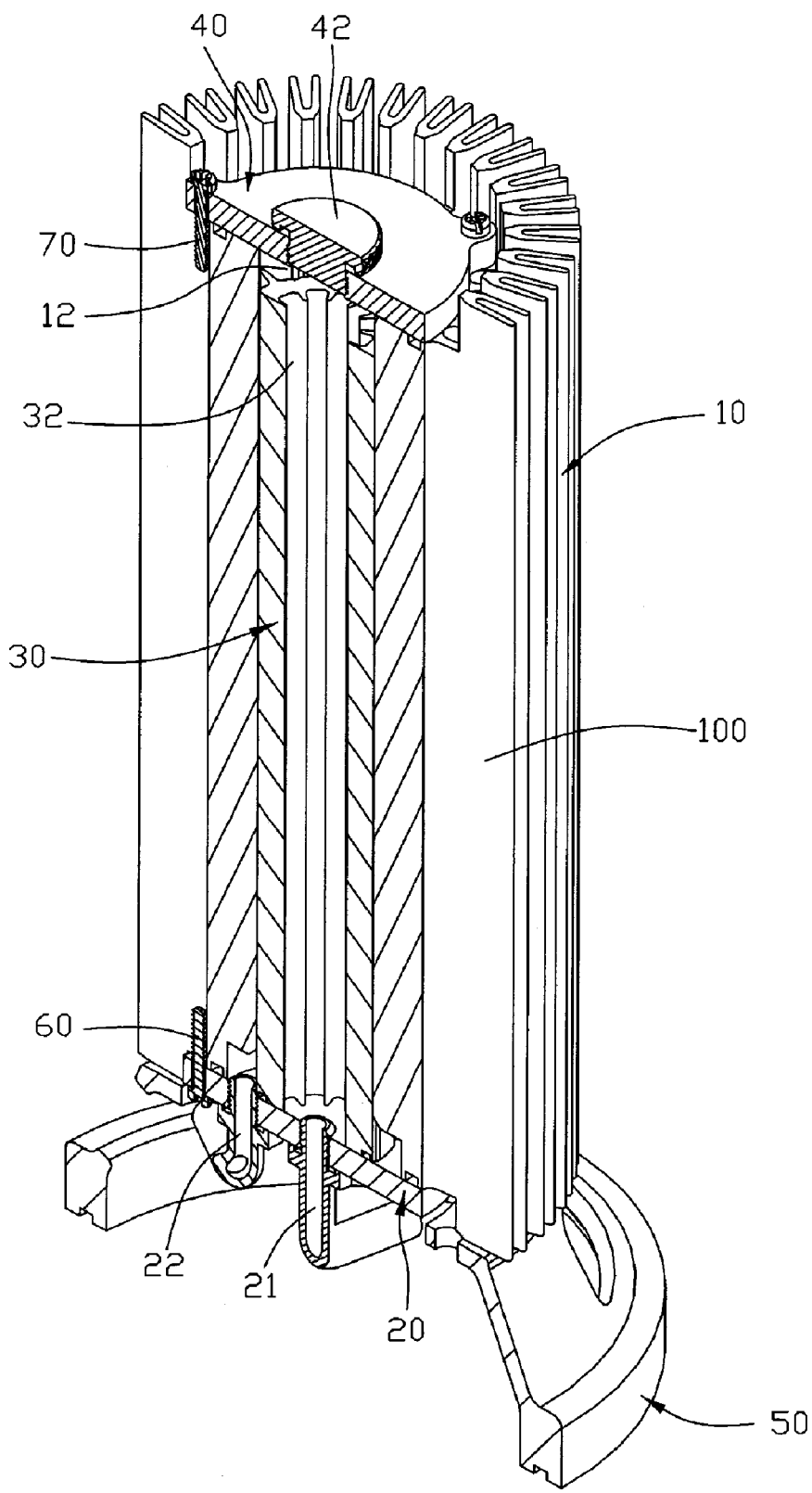
FIG. 4 is a longitudinal sectional view of the heat sink of FIG. 3.
Figure 5:
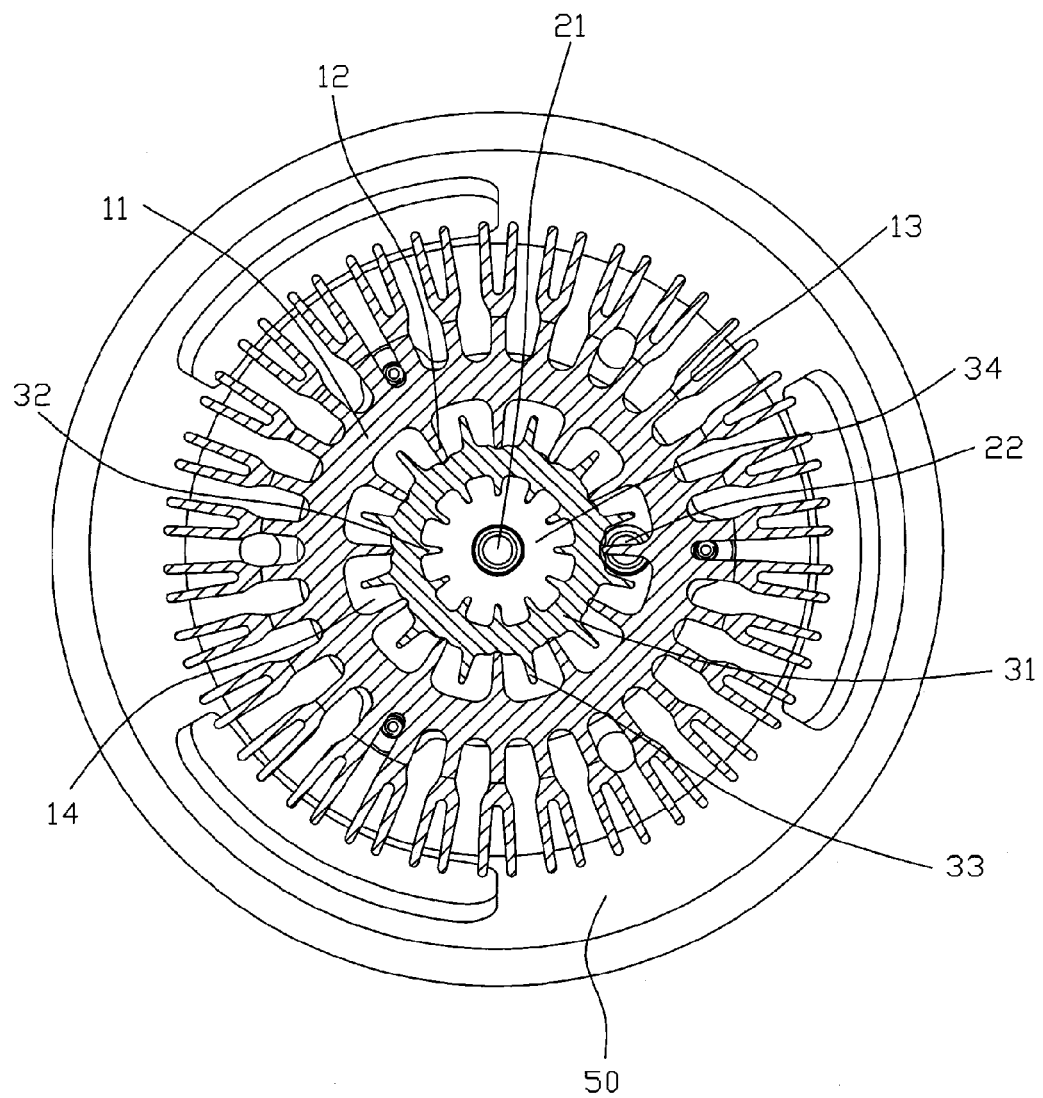
FIG. 5 is a cross sectional view of FIG. 3, taken along line V-V thereof.

Particularly referring to FIGS. 4 and 5, a first receiving chamber 34 is enclosed by the top surface of the first covering plate 20 and an inner surface of the inner tube 30. A second receiving chamber 14 is enclosed by the top surface of the first covering plate 20, an inner surface of the outer tube 100 and an outer surface of the inner tube 30. The second covering plate 40 spaces a distance from a top end of the inner tube 30, so that the first receiving chamber 34 communicates with the second receiving chamber 14 at a top end of the heat sink 10. Alternatively, the second covering plate 40 may contact with the top end of the inner tube 30, with the first receiving chamber 34 communicating with the second receiving chamber 14 via a plurality of holes or grooves (not shown) extending through a sidewall of the inner tube 30.

The first covering plate 20 defines an inlet opening 21 at a center thereof communicating with the first receiving chamber 34, and an outlet opening 22 adjacent to an edge thereof communicating with the second receiving chamber 14. The working fluid enters into the heat sink 10 via the inlet opening 21 and then flows through the first and second receiving chambers 34, 14 in that order, and finally leaves the heat sink 10 via the outlet opening 22.

Furthermore, the first and second covering plates 20, 40 each define three ears 24, 43 evenly distributed around peripheries thereof with three screws holes 241, 431 respectively defined therein for extension of screws 60, 70 to mount the first and second covering plates 20, 40 to the heat sink 10. Alternatively, the first covering plate 20 may be integrally formed with the outer tube 100 or/and the inner tube 30 to simplify the assembly of the liquid cooling device 1. The second covering plate 40 defines an aperture 41 in a center portion thereof. The aperture 41 is devised for facilitating injection of the working fluid into the liquid cooling device 1. A sealing cover 42 is screwed in the aperture 41 after the working fluid has been injected into the liquid cooling device 1 with a sufficient amount. The second covering plate 40 is made of acrylics transparent material so as to watch the fluid level of the working fluid in the first and second receiving chambers 34, 14 to decide whether it is need to supplement the working fluid.

In this embodiment, the bottom end of the inner tube 30 is coplanar with the bottom end of the outer tube 100. Alternatively, the bottom end of the inner tube 30 may be disposed above the bottom end of the outer tube 100. In this configuration, the outer tube 100 and the inner tube 30 are separately sealed via two covering plates, i.e., the first covering plate 20 disposed on the bottom end of the outer tube 100, and a third covering plate (not shown) disposed on the bottom end of the inner tube 30. The third covering plate is parallel to and spaces a distance from the first covering plate 20. The third covering plate is located above the first covering plate 20. The third covering plate also defines an outlet opening in alignment with the outlet opening 22 and in communication with the second receiving chamber 14. The conduit 5 connected with the inlet opening 21 extends through the third covering plate and is fixed thereto for entering the working fluid into the heat sink 10.

The outer tube 100 is made of materials having good thermal conductivities, such as aluminum and copper, and formed by extrusion or die casing. The outer tube 100 includes a tubular heat conductive main body 11, a plurality of inner fins 12 radially extending inwardly from the main body 11, and a plurality of outer fins 13 radially extending outwardly from the main body 11. The inner fins 12 absorb heat from the working fluid filled in the second receiving chamber 14 and transfer the heat to the main body 11. The outer fins 13 absorb heat from the main body 11 and dissipate the heat to the surrounding environment. Each of the outer fins 13 is Y-shaped in profile and has two branches (not labeled) extending from a trunk (not labeled) thereof, whereby heat dissipating area of the outer fins 13 is increased.

Top and bottom ends of each of the outer fins 13 axially extend above and below the main body 11, which further increases heat dissipating areas of the heat sink 10. Two indents (not labeled) are formed at the top and bottom ends of the outer tube 100. The first and second covering plates 20, 40 are accommodated in the indents so as to decrease the size of the heat sink 10 and give the heat sink 10 with an aesthetic integrity. The inner fins 12 radially extend into the second receiving chamber 14 and contact with an outer surface of the inner tube 30. The second receiving chamber 14 is therefore divided into a plurality of separated axial channels (not labeled, see FIG. 5). The bottom ends of the inner fins 12 spaces distances from the top surface 23 of the first covering plate 20 so that the axial channels communicate with each other at a bottom end of the second receiving chamber 14. The working fluid filled in the axial channels influxes together at the bottom end of the second receiving chamber 14 and leaves the heat sink 10 via the outlet opening 22. Alternatively, the bottom ends of the inner fins 12 may contact with the top surface 23 of the first covering plate 20, with the axial channels communicating with each other via holes or grooves (not shown) extending through the inner fins 12.

In this embodiment, the inner fins 12 and the outer fins 13 are evenly distributed around and parallel to an axis of the outer tube 100. Alternatively, the inner fins 12 and the outer fins 13 may be spirally extended on inner and outer surfaces of the main body 11 of the outer tube 100 from the bottom end to the top end thereof to increase turbulence of the working fluid.

The inner tube 30 is made of materials having good thermal conductivities, such as aluminum and copper, and formed by extrusion or die casing. The inner tube 30 includes a tubular heat conductive main body 31, a plurality of inner fins 32 radially extending inwardly from the main body 31, and a plurality of outer fins 33 radially extending outwardly from the main body 31. The inner fins 32 radially and inwardly extend into the first receiving chamber 34, absorbing heat from the working fluid filled therein and transferring the heat to the main body 31. The outer fins 33 radially and outwardly extend into the second receiving chamber 14, absorbing heat from the main body 31 and dissipating the heat to the working fluid filled in the second receiving chamber 14. The outer fins 33 of the inner tube 30 are alternately arranged with the inner fins 32 of the outer tube 100 so as to increase turbulence of the working fluid flowing through the second receiving chamber 14. The heat exchange efficiency between the outer and the inner tubes 10, 30 are therefore increased.

The seat 50 is disposed below the heat sink 10, mounting the heat sink 10 inside or outside of an electronic apparatus (not shown) such as a desktop, or a notebook, depending on whether an inner space of the electronic apparatus is large enough to receive the heat sink 10. The seat 50 is cone-shaped in profile, and made of metal or plastics. Preferably it is made of plastics. The seat 50 includes a ring-like platform 51 at a top end thereof. Three through holes 510 are evenly distributed around the platform 51 for extension of three screws (not shown) to mount the heat sink 10 on the seat 50.

In operation of the liquid cooling device 1, the base 2 is attached to the heat source and absorbs heat therefrom. The working fluid filled in the base 2 absorbs heat from the base 2 and is pumped to the heat sink 10 via the drive of the pump 3. The working fluid enters into the heat sink 10 via the inlet opening 21 and flows through the first receiving chamber 34 of the heat sink 10. One part of the heat carried by the working fluid is transferred to the inner fins 32 of the inner tube 30 and then to the main body 31 and the outer fins 33 thereof. The other part of the heat is carried by the working fluid and enters into the second receiving chamber 14. This part of the heat is transferred to the inner fins 12 of the outer tube 100 and then to the main body 11 and the outer fins 13 thereof. The one part of the heat transferred to the main body 31 and the outer fins 33 of the inner tube 30 is transferred to the working fluid in the second receiving chamber 14 and then to the main body 11 and the outer fins 13 of the outer tube 100. The heat is finally dissipated to the surrounding environment via heat exchanges between the main body 11 and outer fins 13 of the outer tube 100 and the airflow provided by the fan 4. The working fluid in the heat sink 10 after being cooled leaves the heat sink 10 via the outlet opening 22 of the heat sink 10 and arrives at the base 2 to proceed with a next circulation of thermal exchange.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A liquid cooling device comprising:
   a base enclosing working fluid therein and adapted for absorbing heat from a heat-generating electronic component;

a heat sink adapted for dissipating the heat generated by the heat-generating electronic component having closed top and bottom ends which are closed via first and second covering plates attached thereto, and comprising an outer tube and an inner tube disposed in the outer tube, wherein first and second receiving chambers are respectively formed in the inner tube and between an inner surface of the outer tube and an outer surface of the inner tube for receiving the working fluid therein, the first receiving chamber communicating with the second receiving chamber at an end thereof so that the working fluid can flow from the first receiving chamber to the second receiving chamber; and a pump driving the working fluid to circulate between the base and the heat sink, wherein when the pump operates, the working fluid flows from the base to the first receiving chamber, then the second receiving chamber and finally back to the base;

wherein the outer tube comprises a main body, a plurality of inner fins extending from the main body into the second receiving chamber, and a plurality of outer fins extending from the main body into a surrounding environment; and wherein the inner tube comprises a plurality of inner fins extending into the first receiving chamber, and a plurality of outer fins extending into the second receiving chamber.

2. The liquid cooling device of claim 1, wherein the first covering plate defines an inlet opening communicating with the first receiving chamber, and an outlet opening communicating with the second receiving chamber.

3. The liquid cooling device of claim 1, wherein the second covering plate defines an aperture therein for supply of the working fluid into the heat sink, a sealing cover being detachably inserted into the aperture to seal the aperture.

4. The liquid cooling device of claim 1, wherein top and bottom ends of the outer fins extend above and below top and bottom ends of the main body to define two indents thereat, the first and second covering plates being received in the two indents.

5. The liquid cooling device of claim 1, wherein the inner fins of the outer tube are alternately arranged with the outer fins of the inner tube.

6. The liquid cooling device of claim 1 further comprising a seat on which the heat sink is seated.

7. A heat sink comprising:
an outer tube having closed top and bottom ends, the outer tube comprising a main body and a plurality of outer fins extending outwardly from the main body and axially beyond an end of the main body;
an inner tube disposed in the outer tube and having a closed bottom end and an opened top end;
first and second receiving chambers respectively formed in the inner tube and between an inner surface of the outer tube and an outer surface of the inner tube for receiving working fluid therein, wherein the first receiving chamber communicates with the second receiving chamber at the top end thereof so that the working fluid can flow from one of the first and second receiving chambers toward the other one thereof; and a first covering plate attached to the end of the main body of the outer tube, wherein the first covering plate is surrounded by portions of the plurality of outer fins extending axially beyond the end of the main body of the outer tube.

8. The heat sink of claim 7 further defining an inlet opening communicating with the one of the first and second receiving chambers for entering of the working fluid into the heat sink, and an outlet opening communicating with the other one of the first and second receiving chambers for the working fluid to leave the heat sink.

9. The heat sink of claim 8, wherein the top and bottom ends of the outer tube are closed via the first and a second covering plates attached thereto, the inlet and outlet openings are defined in the first covering plate.

10. The heat sink of claim 9, wherein the top end of the inner tube spaces a distance from the second covering plate to maintain the top end of the inner tube being opened.

11. The heat sink of claim 7, wherein the outer tube comprises a plurality of inner fins extending into the second receiving chamber, the plurality of outer fins of the outer tube extending into a surrounding environment.

12. The heat sink of claim 11, wherein the inner tube comprises a plurality of inner fins extending into the first receiving chamber, and a plurality of outer fins extending into the second receiving chamber.

13. The heat sink of claim 7 further comprising a seat on which the heat sink is seated.

14. The heat sink of claim 13, wherein the heat sink fluidically connects with a base which absorbs heat from a heat-generating electronic component and a pump which pumps the working fluid to circulate between the heat sink and the base.

15. A liquid cooling device comprising:
a base for thermally contacting a heat-generating electronic component;
a heat sink having an outer tube and an inner tube disposed in the outer tube, wherein a first receiving chamber is defined in the inner tube and a second receiving chamber is defined between the outer and inner tubes, and wherein the inner tube has outer fins extending into the second receiving chamber; and
a pump for driving working liquid to flow from the base to the first receiving chamber, then the second receiving chamber and finally back to the base;
wherein the heat sink further comprises a transparent top cover surrounded by upper portions of outer fins formed on the outer tube and a fan mounted at a top of the heat sink.

16. The liquid cooling device of claim 15 further comprising a first conduit interconnecting the base and the first receiving chamber and a second conduit interconnecting the base and the second receiving chamber.

17. The heat sink of claim 7, wherein the first covering plate comprises a plurality of circumferentially distributed ears attached to the outer tube.

18. The heat sink of claim 12, wherein the plurality of inner fins of the outer tube is in contact with the inner tube, and the plurality of outer fins of the inner tube is spaced from the outer tube.

* * * * *